US011784566B2

(12) United States Patent
Nicolosi

(10) Patent No.: US 11,784,566 B2
(45) Date of Patent: Oct. 10, 2023

(54) SOFT-START OF A DC-DC CONVERTER BASED ON CAPACITOR SWITCHING

(71) Applicant: STMicroelectronics S.r.l., Agrate Brianza (IT)

(72) Inventor: Alessandro Nicolosi, Dresano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 143 days.

(21) Appl. No.: 17/526,984

(22) Filed: Nov. 15, 2021

(65) Prior Publication Data

US 2022/0166318 A1 May 26, 2022

(30) Foreign Application Priority Data

Nov. 24, 2020 (IT) .......................... 102020000028115

(51) Int. Cl.
*H02M 3/158* (2006.01)
*H02M 1/36* (2007.01)

(52) U.S. Cl.
CPC ............. *H02M 3/158* (2013.01); *H02M 1/36* (2013.01)

(58) Field of Classification Search
CPC ...... H02M 3/158; H02M 1/36; H02M 1/0025; H02M 3/156
See application file for complete search history.

(56) References Cited

U.S. PATENT DOCUMENTS

| 2008/0278129 A1* | 11/2008 | Shimizu ................. H02M 1/32 323/282 |
| 2013/0169324 A1 | 7/2013 | Huang et al. |
| 2014/0217999 A1* | 8/2014 | Wibben ................. G05F 1/468 323/282 |
| 2015/0162830 A1 | 6/2015 | Dong et al. |
| 2016/0049866 A1 | 2/2016 | Sumii et al. |

OTHER PUBLICATIONS

Wang, L.Y, et al., "A Monolithic High-Performance Buck Converter With Enhanced Current-Mode Control and Advanced Protection Circuits," IEEE Transactions on Power Electronics, vol. 31, No. 01, Jan. 2016, 13 pages.

* cited by examiner

*Primary Examiner* — Adolf D Berhane
*Assistant Examiner* — Afework S Demisse
(74) *Attorney, Agent, or Firm* — Slater Matsil, LLP

(57) ABSTRACT

In an embodiment a direct current to direct current (DC-DC) converter includes a first switching circuit configured to switch a supply of an input voltage to an energy storage circuit configured to generate an output voltage, a driving circuit configured to drive the first switching circuit according to a comparison between the output voltage and a comparison voltage and a soft-start circuit configured to raise the comparison voltage from a start voltage to a target voltage during a soft-start phase of the DC-DC converter having a soft-start duration, wherein the soft-start circuit comprises a soft-start capacitor configured to provide the comparison voltage during the start phase, the soft-start capacitor having a soft-start capacitance, an auxiliary capacitor having an auxiliary capacitance, a second switching circuit configured to alternately charge and discharge the auxiliary capacitor with an auxiliary current according to a clock signal having a clock frequency and a charging circuit.

18 Claims, 5 Drawing Sheets

SOFT-START OF A DC-DC CONVERTER BASED ON CAPACITOR SWITCHING

CROSS-REFERENCE TO RELATED APPLICATIONS

This application claims the benefit of Italian Application No. 102020000028115, filed on Nov. 24, 2020, which application is hereby incorporated herein by reference.

TECHNICAL FIELD

The present disclosure relates to the field of electronics. More specifically, this disclosure relates to DC-DC converters.

BACKGROUND

The background of the present disclosure is hereinafter introduced with the discussion of techniques relating to its context. However, even when this discussion refers to documents, acts, artifacts and the like, it does not suggest or represent that the discussed techniques are part of the prior art or are common general knowledge in the field relevant to the present disclosure.

Direct Current to Direct Current (DC-DC) converters are a particular type of power converters (converting electric energy between different forms) that are used to convert an input voltage of direct type into an output voltage of direct type as well but having a different value. For example, in DC-DC converters of buck (or step-down) type the output voltage is lower than the input voltage. The DC-DC converters may find application in several electronic systems; for example, the DC-DC converters allow supplying multiple components of an electronic system operating at different voltages with a single power supply voltage (such as provided by a battery), or they allow exploiting components designed to work at certain voltages in electronic systems working at different voltages (such as of older generations).

Practical DC-DC converters used in electronics applications are based on switching techniques. Generally speaking, in a DC-DC converter of this type the input voltage is alternately applied to an energy storage circuit (for example, an inductor and a capacitor), by repeatedly switching it on and off; as a result, energy is accumulated temporarily in the energy storage circuit and it is then released to a load of the DC-DC converter, so as to provide the output voltage with a value depending on a duty-cycle of the switching; for this purpose, the switching is controlled according to a comparison between the output voltage and a comparison voltage (proportional to the desired value of the output voltage). A core of the DC-DC converter providing the switching is generally implemented as an integrated circuit, with a few external components (comprising the energy storage circuit) that are added to complete the DC-DC converter. The switching techniques are very efficient, since they limit dissipation of power as heat (only occurring during the switching phases).

Whenever a DC-DC converter is turned on, no energy is generally available in its energy storage circuit and then the output voltage has a null value; therefore, at the beginning a high amount of energy would be injected into the energy storage circuit, with a corresponding overshooting of the output voltage. In order to avoid this, the DC-DC converter is generally provided with a soft-start circuit. The soft-start circuit gradually raises the comparison voltage from the null value to a target value thereof during a corresponding (soft-start) phase. The soft-start phase has a duration that is relatively long, so as to ensure a smooth operation of the DC-DC converter (for example, of the order of a few ms); moreover, it is preferable to have the possibility of controlling the duration of the soft-start phase accurately and of programming it to adapt the DC-DC converter to different applications.

The soft-start circuit may be implemented with a (soft-start) capacitor that is gradually charged from the null value to the target value. When the DC-DC converter is in integrated form, the soft-start capacitor may be provided as either an external component or an internal component of its integrated circuit. In case the soft-start capacitor is an external component, this requires an additional terminal in the integrated circuit (dedicated to the soft-start capacitor) and an additional component in the DC-DC converter. On the other hand, in case the soft-start capacitor is an internal component, its capacitance is relatively low (of the order of a few pF) for limiting a corresponding area occupation in the integrated circuit, and then a very low (soft-start) current (of the order of a few nA) is to be used to charge the soft-start capacitor for obtaining the required long duration of the soft-start period; however, this makes it difficult trimming the soft-start capacitor and the soft-start current, thereby affecting an accuracy of the duration of the soft-start period. Alternatively, the soft-start circuit may be implemented with a Digital-to-Analog Converter (DAC), provided as an internal component of the integrated circuit of the DC-DC converter, which DAC controls the comparison voltage according to a corresponding counter. However, a relatively high resolution of the DAC (in terms of number of bits) is required to provide a gradual raising of the comparison voltage; all of the above increases a complexity of the integrated circuit.

SUMMARY

Embodiments provide a DC-DC converter configured to charge a soft-start capacitor according to the switching of an auxiliary capacitor.

Further embodiments provide a DC-DC converter with a soft-start circuit for raising a comparison voltage at a soft-start capacitor during a soft-start phase of the DC-DC converter. For this purpose, a soft-start current is generated by charging and discharging an auxiliary capacitor with an auxiliary current according to a clock signal. The soft-start capacitor is charged with this soft-charge current thereby making a duration of the soft-start phase depending on the clock frequency, on a ratio between the capacitances of the soft-start capacitor and of the auxiliary capacitor and on a ratio between the auxiliary current and the soft-start current.

Further embodiments provide a system comprising one or more DC-DC converters as above.

Yet further embodiments provide a corresponding method.

BRIEF DESCRIPTION OF THE DRAWINGS

The solution of the present disclosure, as well as further features and the advantages thereof, will be best understood with reference to the following detailed description thereof, given purely by way of a non-restrictive indication, to be read in conjunction with the accompanying drawings (wherein, for the sake of simplicity, corresponding elements are denoted with equal or similar references and their explanation is not repeated, and the name of each entity is generally used to denote both its type and its attributes, like value, content and representation). In this respect, it is expressly intended that the drawings are not necessary drawn to scale (with some details that may be exaggerated and/or simplified) and that, unless otherwise indicated, they are merely used to illustrate the structures and procedures described herein conceptually.

DETAILED DESCRIPTION OF ILLUSTRATIVE EMBODIMENTS

Figure 1:
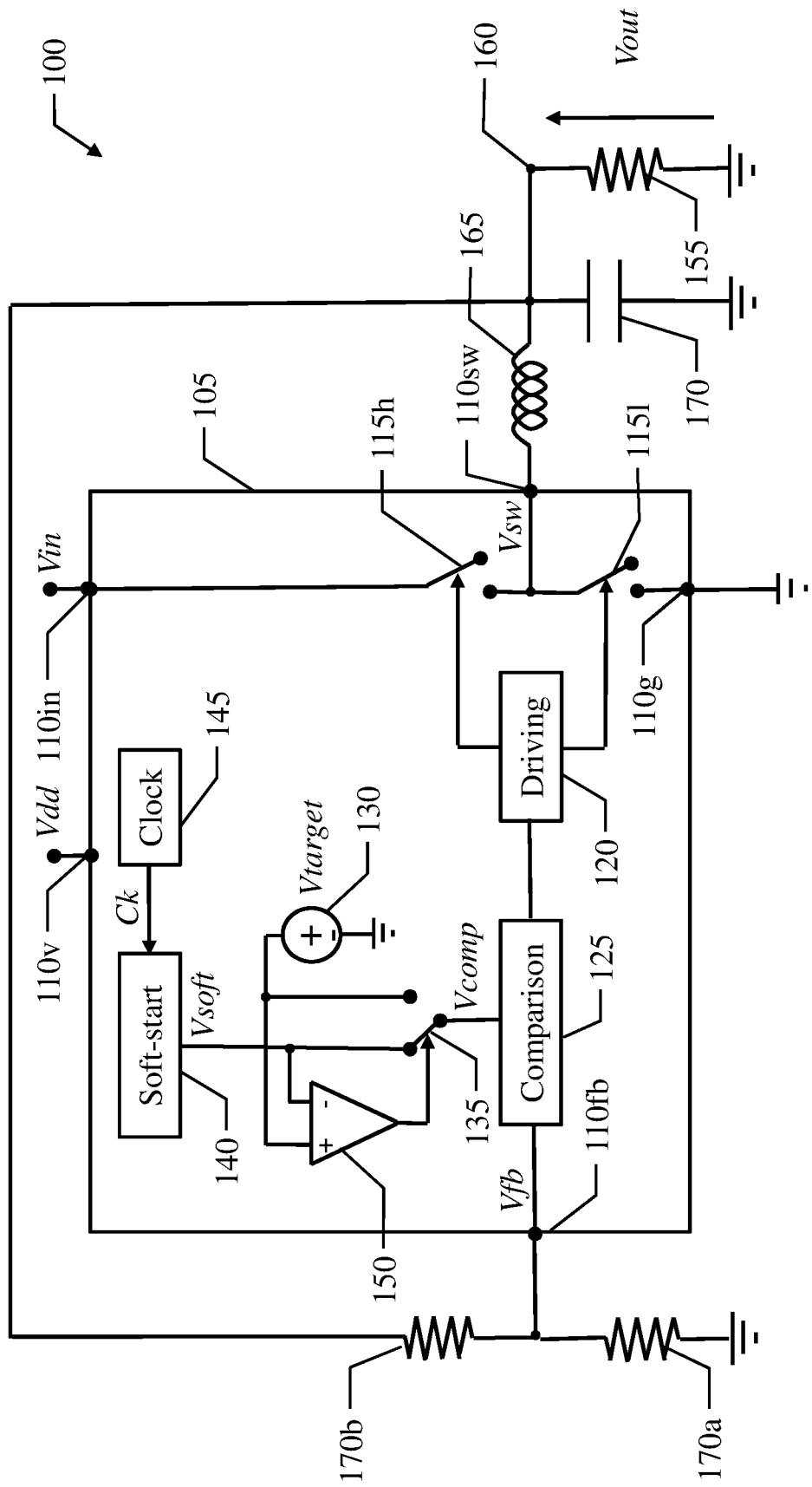
FIG. 1 shows a schematic block diagram of a DC-DC converter.

With reference in particular to FIG. 1, a schematic block diagram is shown of a DC-DC converter 100 wherein the solution according to an embodiment of the present disclosure may be applied.

The DC-DC converter 100 is used to convert an input voltage (of direct type) Vin into an output voltage (of direct type) Vout having a different value, Particularly, the DC-DC converter 100 is of buck type, wherein the output voltage Vout is lower than the input voltage Vin; for example, the input voltage Vin may range from a few V to several tens of V whereas the output voltage may range from a fraction of V to several tens of V, with respect to a reference (or ground) voltage GND (0V).

As far as relevant to the present disclosure, the DC-DC converter 100 comprises the following components.

A core of the DC-DC converter 100 is implemented as an integrated circuit 105, which is integrated on a semiconductor bulk (such as a die of semiconductor material, for example, silicon) so as to define a corresponding chip.

The integrated circuit 105 has a (ground) terminal 110*g* for receiving the ground voltage GND and a (supply) terminal 110*v* for receiving a (power) supply voltage Vdd of direct type (for example, 2-5V with respect to the ground voltage GND). The integrated circuit 105 has an (input) terminal 110in for receiving the input voltage Vin and a (switching) terminal 110*sw* for providing a switching voltage Vsw (switching between the input voltage Vin and the ground voltage GND). The integrated circuit 105 has a (feedback) terminal 110*fb* for receiving a feedback voltage Vfb corresponding to the output voltage Vout (for example, equal to a fraction thereof).

A switching circuit provides the switching voltage Vsw. The switching circuit is implemented with a (high-side) switch 115*h* and a (low-side) switch 115*l*, such as corresponding MOS transistors, in half-bridge configuration; particularly, the switches 115*h* and 115*l* are connected in series between the ground terminal 110*g* and the input terminal 110in, with a central node thereof that is coupled with the switching terminal 110*sw*. A driving circuit 120 drives the switches 115*h* and 115*l* so as to turn on and off them alternately (apart from a possible dead-time during which both of them are turned off to avoid creating a short-circuit between the input terminal 110in and the ground terminal 110*g*); when the switch 115*h* is on and the switch 115*l* is off, the input voltage Vin is applied to the switching terminal 110*sw*, whereas when the switch 115*h* is off and the switch 115*l* is on, the ground voltage GND is applied to the switching terminal 110*sw*. The driving circuit 120 operates in a Pulse-Width Modulation (PWM) mode, wherein the switching has a duty-cycle (defined by a fraction of each period of the switching during which the switch 115*h* is on) corresponding to the amount of energy to be delivered by the switching circuit 115*h*,115*l*. A comparison circuit 125 has an input terminal coupled with the feedback terminal 110*fb* for receiving the feedback voltage Vfb, and another input terminal for receiving a comparison voltage Vcomp; the comparison circuit 125 has an output terminal coupled with the driving circuit 120 for controlling it according to a difference between the comparison voltage Vcomp and the feedback voltage Vfb (with the duty-cycle that evolves in the direction of increasing its value if the feedback voltage Vfb is lower than the comparison voltage Vcomp or vice-versa, up to reach a steady condition when the feedback voltage Vfb becomes equal to the comparison voltage Vcomp).

A voltage generator 130 (for example, of band-gap type) provides a target voltage Vtarget (with reference to the ground voltage GND). A (three-way) switch 135 has an input terminal coupled with the voltage generator 130 for receiving the target voltage Vtarget and another input terminal for receiving a soft-start voltage Vsoft; the switch 135 has an output terminal coupled with the corresponding input terminal of the comparison circuit 125 for providing the comparison voltage Vcomp. A soft-start circuit 140 provides the soft-start voltage Vsoft, raising gradually from the ground voltage GND to the target voltage Vtarget (as described in detail in the following). A clock generator 145 is coupled with the soft-start circuit 140 for providing a clock signal Ck (oscillating between the ground voltage GND and the supply voltage Vdd with a very accurate clock frequency fck); the clock generator 145 may be implemented with a dedicated circuit inside the integrated circuit 105, or the clock signal Ck may be received from outside the integrated circuit 105 via a dedicated terminal thereof (not shown in the figure). A comparator 150 has a positive terminal coupled with the voltage generator 130 for receiving the target voltage Vtarget and a negative terminal coupled with the soft-start circuit 140 for receiving the soft-start voltage Vsoft; the comparator 150 has an output terminal for controlling the switch 135 according to a difference between the target voltage Vtarget and the soft-start voltage Vsoft.

The DC-DC converter 100 further comprises external components that are coupled with its terminals. Particularly, an energy storage circuit temporarily accumulates the energy provided by the switching circuit 115*h*,115*l* and releases it to a load 155 of the DC-DC converter, for example, represented by a resistor, for this purpose, the energy storage circuit is coupled between the switching terminal 110*sw* and an output terminal 160 for providing the output voltage Vout to the load 155 (coupled between the output terminal 160 and the ground terminal 110*g*). The energy storage circuit is implemented with an inductor 165 and a capacitor 170. The inductor 165 is coupled between the switching terminal 110*sw* and the output terminal 160, and the capacitor 170 is coupled between the output terminal 160 and the ground terminal 110*g*. A feedback circuit generates the feedback voltage Vfb from the output voltage Vout. For example, the feedback circuit is implemented with a voltage divider, which comprises two resistors 175*a* and 175*b*; the resistors 175*a*,175*b* are coupled in series between the output terminal 160 and the ground terminal 110g, with a central tap (common thereto) that is coupled with the feedback terminal 110fb.

In operation, when the switch 115h is turned on and the switch 115l is turned off (so that the input voltage Vin is applied to the switching terminal 110sw), the inductor 165 takes a voltage equal to a difference between the input voltage Vin and the output voltage Vout; a current flowing through the inductor 165 then increases (thereby accumulating energy therein); when the switch 115h is turned off and the switch 115l is turned on (so that the ground voltage GND is applied to the switching terminal 110sw), the inductor 165 takes a voltage equal to the opposite of the output voltage Vout; the current flowing through the inductor 165 then decreases (thereby delivering the energy stored therein). The capacitor 170 acts as a filter that maintains the current flowing through the load 155 (and then the output voltage Vout) substantially constant, by absorbing and delivering current when the current through the inductor 165 increases and decreases, respectively. The comparator 125 controls the driving circuit 120 to increase the duty-cycle, and then the energy delivered to the inductor 165 with a corresponding increase of the output voltage Vout, until the feedback voltage Vfb (equal to a fraction thereof) reaches the comparison voltage Vcomp.

Whenever the DC-DC converter 100 is turned on the soft-start circuit 140 generates the soft-start voltage Vsoft (raising gradually from the ground voltage GND to the target voltage Vtarget). During a soft-start phase of the DC-DC converter 110 wherein the soft-start voltage Vsoft is lower than the target voltage Vtarget, the comparator 150 commands the switch 135 to pass the soft-start voltage Vsoft to the comparison circuit 125. Therefore, the comparison circuit 125 controls the driving circuit 120 to drive the switching circuit 115h,115l for gradually increasing the output voltage Vout accordingly from the ground voltage GND to its desired value (with a reduced duty-cycle limiting the current injected into the inductor 165). Once the soft-start voltage Vsoft has reached the target voltage Vtarget, the soft-start phase ends and the DC-DC converter 110 enters a steady condition. Particularly, the comparator 150 now commands the switch 135 to pass the target voltage Vtarget to the comparison circuit 125. Therefore, the comparison circuit 125 controls the driving circuit 120 to drive the switching circuit 115h,115l for maintaining the output voltage Vout at the desired value (given by the feedback voltage Vfb equal to the target voltage Vtarget). Therefore, for a fixed value of the target voltage Vtarget, it is possible to program the desired value of the output voltage Vout by choosing the resistors 175a,175b accordingly (being the feedback voltage Vfb equal to a fraction of the output voltage Vout depending on their resistances).

The soft-start voltage Vsoft is provided by gradually charging a corresponding (soft-start) capacitor. In the solution according to an embodiment of the present disclosure, an (auxiliary) capacitor is provided for controlling the charging of the soft-start capacitor. Particularly, the auxiliary capacitor is charged and discharged with an (auxiliary) current according to the clock signal Ck. A (soft-start) current is then generated according to the charging and discharging of the auxiliary capacitor, and this soft-start current is applied to the soft-start capacitor. Therefore, an amount of electrical charge that is transferred to the soft-start capacitor during each period of the clock signal Ck is related to the time required to charge the auxiliary capacitor, and then the soft-start current depends on a capacitance of the auxiliary capacitor, on the auxiliary current and on the clock frequency. As a result, a time required to charge the soft-start capacitor from the ground voltage GND to the target voltage Vtarget (defining a duration of the soft-start phase) depends on the clock frequency, on a ratio between the capacitances of the soft-start capacitor and of the auxiliary capacitor and on a ratio between the auxiliary current and the soft-start current. It is then possible to obtain any (relatively) long duration of the soft-start phase, starting from the (relatively) short period of the clock signal Ck, by making the ratio between the soft-start capacitance and the auxiliary capacitance and/or the ratio between the auxiliary current and the soft-start current sufficiently high.

As described in detail in the following, this result may be achieved in different ways.

Figure 2:
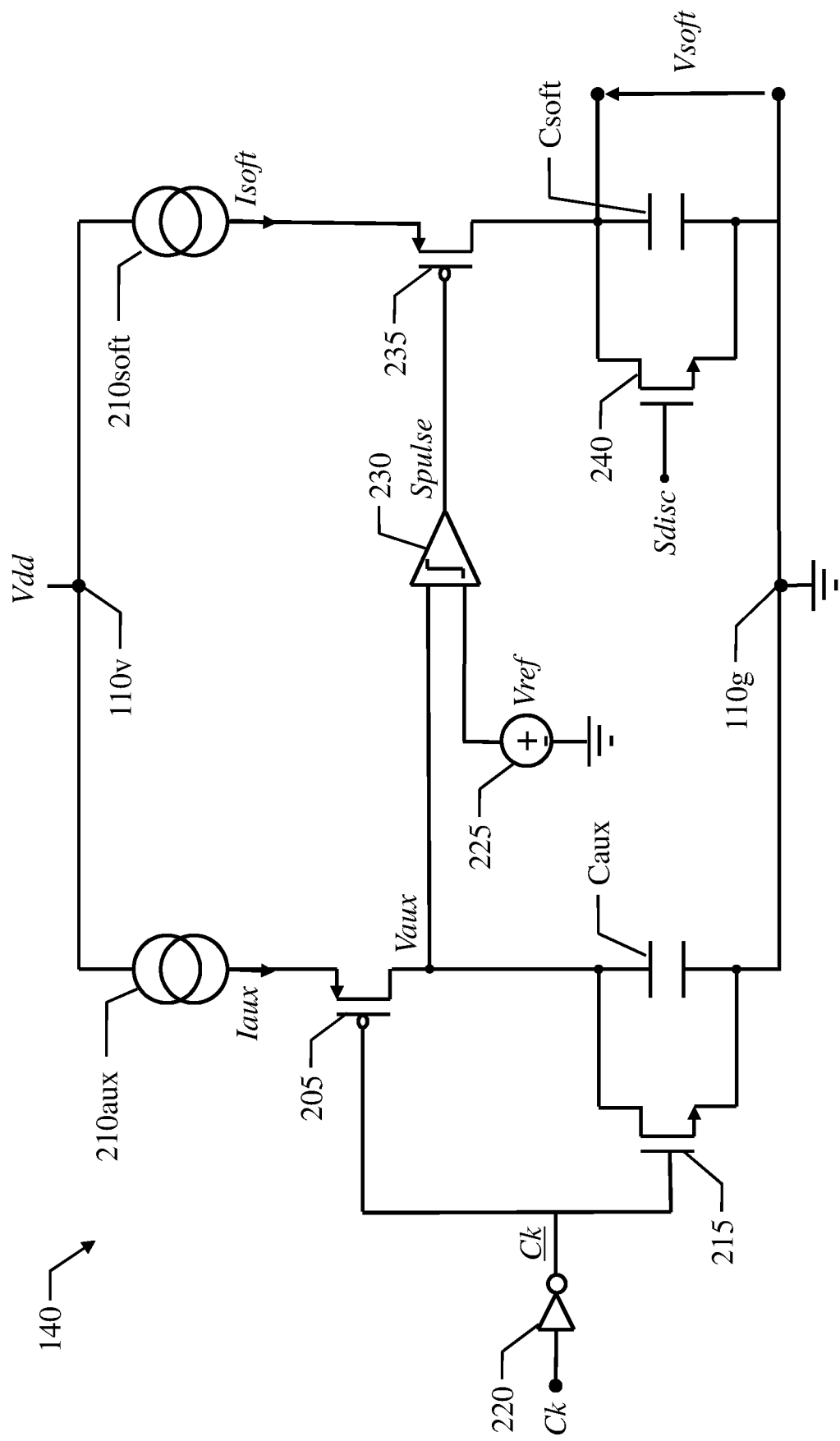
FIG. 2 shows a simplified circuital schema of a soft-start circuit of the DC-DC converter according to an embodiment.

With reference now to FIG. 2, a simplified circuital schema is shown of the soft-start circuit 140 of the DC-DC converter according to an embodiment of the present disclosure.

The soft-start circuit 140 comprises the following components. A (soft-start) capacitor Csoft provides the soft-start voltage Vsoft. An (auxiliary) capacitor Caux controls the charging of the capacitor Csoft. The capacitor Caux is coupled between the ground terminal 110g and the supply terminal 110v via a switch, for example, a PMOS transistor 205 and an (auxiliary) current generator 210aux. Particularly, a terminal of the capacitor Caux is coupled with the ground terminal 110g, another terminal of the capacitor Caux is coupled with a drain terminal of the PMOS transistor 205, a source terminal of the PMOS transistor 205 is coupled with a negative terminal of the current generator 210aux and a positive terminal of the current generator 210aux is coupled with the supply terminal 110v. A further switch, for example, an NMOS transistor 215 is coupled in parallel to the capacitor Caux. Particularly, a source terminal of the NMOS transistor 215 is coupled with the terminal of the capacitor Caux coupled with the ground terminal 110g, and a drain terminal of the NMOS transistor 215 is coupled with the other terminal of the capacitor Caux.

An inverter 220 has an input terminal for receiving the clock signal Ck, and an output terminal coupled with both a gate terminal of the PMOS transistor 205 and a gate terminal of the NMOS transistor 215, for providing them the clock signal Ck being inverted (inverted clock signal $\overline{Ck}$). A voltage generator 225 (for example, of band-gap type) provides a reference voltage Vref (with reference to the ground voltage GND); the reference voltage Vref is strictly lower than the supply voltage Vdd (for example, 20-50% thereof). A pulse generator 230 has a positive terminal coupled with the terminal of the capacitor Caux coupled with the PMOS transistor 205 for receiving an (auxiliary) voltage Vaux at the capacitor Caux (with respect to the ground voltage GND), and a negative terminal coupled with the voltage generator 225 for receiving the reference voltage Vref; the pulse generator 230 has an output terminal for providing a pulse signal Spulse according to a comparison between the auxiliary voltage Vaux and the reference voltage Vref. For example, the pulse generator 230 comprises a comparator and a (masking) OR gate; the comparator has a positive terminal for receiving the auxiliary voltage Vaux, a negative terminal for receiving the reference voltage Vref and an output terminal coupled with an input terminal of the OR gate, which has another input terminal for receiving the inverted clock signal $\overline{Ck}$ and an output terminal for providing the pulse signal Spulse.

Likewise, the capacitor Csoft is coupled between the ground terminal 110g and the supply terminal 110v via a switch, for example, a PMOS transistor 235 and a (soft-start)

current generator 210soft. Particularly, a terminal of the capacitor Csoft is coupled with the ground terminal 110g, another terminal of the capacitor Csoft is coupled with a drain terminal of the PMOS transistor 235, a source terminal of the PMOS transistor 235 is coupled with a negative terminal of the current generator 210soft and a positive terminal of the current generator 210soft is coupled with the supply terminal 110v. A further switch, for example, an NMOS transistor 240 is coupled in parallel to the capacitor Csoft. Particularly, a source terminal of the NMOS transistor 240 is coupled with the terminal of the capacitor Csoft coupled with the ground terminal 110g, and a drain terminal of the NMOS transistor 240 is coupled with the other terminal of the capacitor Csoft. A gate terminal of the NMOS transistor 240 receives a discharge signal Sdisc, for example, provided by a control circuit of the DC-DC converter.

A capacitance of the capacitor Caux is lower than a capacitance of the capacitor Caux (both of them denoted with the same references); particularly, the capacitance Csoft is a multiple of the capacitance Caux by a scale factor Kc>1 (Csoft=Kc·Caux), for example, with Kc=10-100. Conversely, a current Iaux provided by the current generator 210aux is higher than a current Isoft provided by the current generator 210soft; particularly, the current Iaux is a multiple of the current Isoft by a scale factor Ki>1 (Iaux=Ki·Isoft), for example, with Ki=10-100. The reference voltage Vref is correlated to the target voltage Vtarget; particularly, the target voltage Vtarget is a multiple of the reference voltage Vref by a scale factor Kv (Vtarget=Kv·Vref), for example, with Kv=0.2-5.0.

Figure 3:
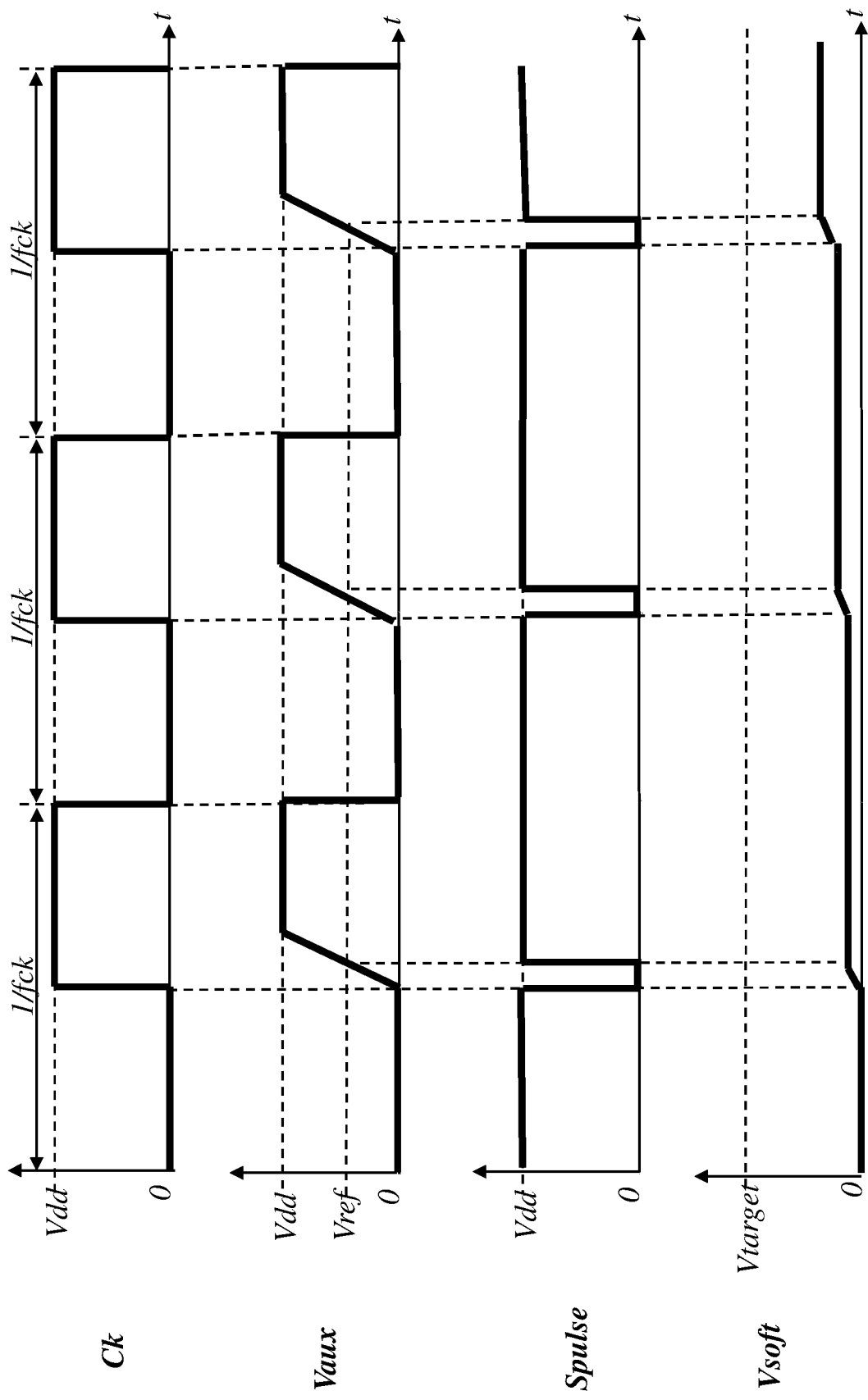
FIG. 3 shows qualitative timing diagrams of some electrical quantities of this soft-start circuit.

Operation of the soft-start circuit 140 is described in the following with reference together to FIG. 2 and to FIG. 3, showing qualitative timing diagrams of some electrical quantities of the soft-start circuit 140. Particularly, the timing diagrams plot the values (on the ordinate axis) of the clock signal Ck, the auxiliary voltage Vaux, the pulse signal Spulse and the soft-start voltage Vsof tagainst the time t (on the abscissa axis), all of them in arbitrary units, during the soft-start phase of the DC-DC converter.

As soon as the DC-DC converter is turned on, the discharge signal Sdisc is asserted to the supply voltage Vdd. Therefore, the NMOS transistor 240 turns on thereby short-circuiting the capacitor Csoft; the capacitor Csoft then completely discharges through the NMOS transistor 240 almost immediately, thereby bringing the soft-start voltage Vsoft to the reference voltage GND. The discharge signal Sdisc is then deasserted to the ground voltage GND, so that the NMOS transistor 240 turns off.

During each period (1/fck) of the clock signal Ck, in a first half-period the clock signal Ck is equal to the ground voltage GND and in a second half-period the clock signal Ck is equal to the supply voltage Vdd. Starting from the first half-period (Ck=GND), the inverted clock signal $\overline{Ck}$ is equal to the supply voltage Vdd. Therefore, the NMOS transistor 215 turns on and the PMOS transistor 205 turns off. The capacitor Caux then completely discharges through the NMOS transistor 215 almost immediately, thereby bringing the auxiliary voltage Vaux to the ground voltage GND. In the second half-period (Ck=Vdd), the inverted clock signal $\overline{Ck}$ is equal to the ground voltage GND. Therefore, the NMOS transistor 215 turns off and the PMOS transistor 205 turns on, thereby coupling the capacitor Caux with the current generator 210aux. The capacitor Caux is then charged by the current generator 210aux (linearly) towards the supply voltage Vdd. The pulse generator 230 accordingly generates the pulse signal Spulse. Particularly, the pulse signal Spulse is normally at the supply voltage Vdd; during each period of the clock signal Ck, the pulse signal Spulse switches to the ground voltage GND during the time required to charge the capacitor Caux from the ground voltage GND to the reference voltage Vref. For example, in the above-mentioned implementation of the pulse generator 230 (based on the comparison of the auxiliary voltage Vaux with the reference voltage Vref masked by the inverted clock signal $\overline{Ck}$) during the first half-period the inverted clock signal $\overline{Ck}$ at the supply voltage Vdd (logic value 1) always maintains the pulse signal Spulse at the supply voltage Vdd (independently of the result of the comparison). During the second half-period, the inverted clock signal $\overline{Ck}$ at the ground voltage GND (logic value 0) passes the result of the comparison to the pulse signal Spulse; therefore, when the auxiliary voltage Vaux is lower than the reference voltage Vref the pulse signal Spulse is at the ground voltage GND, whereas when the auxiliary voltage Vaux is higher than the reference voltage Vref the pulse signal Spulse is at the supply voltage Vdd. During each pulse of the pulse signal Spulse at the ground voltage GND the PMOS transistor 235 turns on, thereby coupling the capacitor Csoft with the current generator 210soft; the current generator 210soft then charges the capacitor Csoft (linearly). During the rest of the period of the clock signal C wherein the pulse signal Spulse is at the supply voltage Vdd, it instead maintains the PMOS transistor 235 turned off; the capacitor Csoft is then insulated from the current generator 210soft (thereby maintaining its voltage). As a result, the voltage Vsoft raises incrementally from the ground voltage GND (up to reach the target voltage Vtarget).

More formally, each pulse of the pulse signal Spulse has a duration Tpulse equal to the time required to charge the capacitor Caux from the ground voltage GND to the reference voltage Vref by the (constant) current Iaux:

$$Tpulse = \frac{Caux \cdot Vref}{Iaux}.$$

During each pulse of the pulse signal Spulse, the capacitor Csoft is charged by the (constant) current Isoft by a (step) voltage Vstep equal to:

$$Vstep = \frac{Isoft \cdot Tpulse}{Csoft} = \frac{Isoft \cdot Caux \cdot Vref}{Csoft \cdot Iaux}.$$

The number of periods Nck of the clock signal Ck required by the soft-start voltage Vsoft at the capacitor Csoft to reach the target voltage Vtarget is:

$$Nck = \frac{Vtarget}{Vstep} = \frac{Vtarget \cdot Csoft \cdot Iaux}{Isoft \cdot Caux \cdot Vref};$$

Therefore, the time required to charge the capacitor Csoft to the target voltage Vtarget, defining the duration Tsoft of the soft-start phase, is:

$$Tsoft = \frac{Nck}{fck} = \frac{Vtarget \cdot Csoft \cdot Iaux}{Isoft \cdot Caux \cdot Vref \cdot fck},$$

and then:

$$Tsoft = \frac{Kv \cdot Vref \cdot Kc \cdot Caux \cdot Ki \cdot Isoft}{Isoft \cdot Caux \cdot Vref \cdot fck} = \frac{Kv \cdot Kc \cdot Ki}{fck}.$$

For example, a soft-start circuit 140 with fck=1.2 MHz, Vref=1V and Vtarget=1V (Kv=1/1=1), Csoft=60 pF and Caux=1 pF (Kc=60/1=60), Iaux=20 µA and Isoft=0.5 µA (Ki=20/0.5=40) provides a soft-start duration Tsoft equal to:

$$Tsoft = \frac{Kv \cdot Kc \cdot Ki}{fck} = \frac{1 \cdot 60 \cdot 40}{1.2 \cdot 10^6} = 2,000 \cdot 10^{-6} = 2 \text{ ms}.$$

The above-described solution allows obtaining a soft-start phase having a relatively long duration (so as to ensure a smooth operation of the DC-DC converter) with capacitors having relatively low capacitances and with currents having relatively high values, provided that the capacitance Csoft is higher than the capacitance Caux (Kc>1) and/or the current Iaux is higher than the current Isoft (Ki>1). This is due to the fact that the capacitor Csoft is charged only during a fraction of each period of the clock signal Ck (as defined by the pulse signal Spulse), which fraction may be made relatively short by decreasing the capacitance Caux and/or increasing the current Iaux. As a result, the soft-start circuit 140 may be provided as an internal component of the integrated circuit of the DC-DC converter with no significant area occupation thereof.

Moreover, the soft-start duration Tsoft is very accurate, since it depends on the clock frequency fck (very accurate by its nature) and on (matching) factors (Kc between capacitances, Ki between currents and Ku between voltages) that may be controlled relatively easily (especially in the manufacturing processes of integrated circuits). The soft-start duration Tsoft may also be programmed by changing the clock frequency fck and/or the reference voltage Vref.

Figure 4:
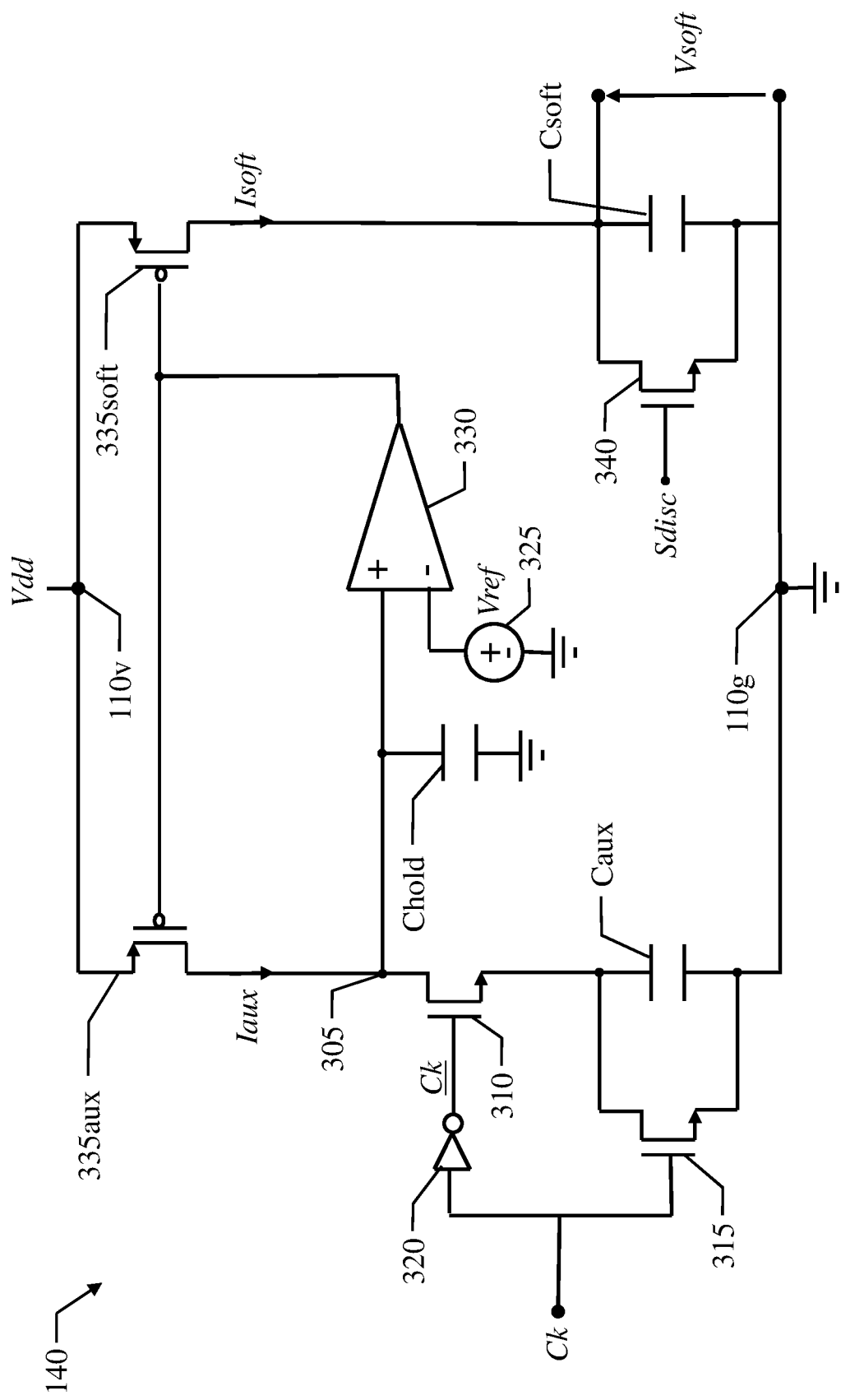
FIG. 4 shows a simplified circuital schema of a soft-start circuit of the DC-DC converter according to a further embodiment.

With reference now to FIG. 4, a simplified circuital schema is shown of the soft-start circuit 140 of the DC-DC converter according to a further embodiment of the present disclosure.

The soft-start circuit 140 comprises the following components. As above, a (soft-start) capacitor Csoft provides the soft-start voltage Vsoft and an (auxiliary) capacitor Caux controls the charging of the capacitor Csoft. The capacitor Caux is coupled between the ground terminal 110g and a reference node 305 via a switch, for example, an NMOS transistor 310. Particularly, a terminal of the capacitor Caux is coupled with the ground terminal 110g, another terminal of the capacitor Caux is coupled with a source terminal of the NMOS transistor 310, and a drain terminal of the NMOS transistor 310 is coupled with the reference node 305. A further switch, for example, an NMOS transistor 315 is coupled in parallel to the capacitor Caux. Particularly, a source terminal of the NMOS transistor 315 is coupled with the terminal of the capacitor Caux coupled with the ground terminal 110g, and a drain terminal of the NMOS transistor 315 is coupled with the other terminal of the capacitor Caux. A gate terminal of the NMOS transistor 315 receives the clock signal Ck directly. An inverter 320 has an input terminal for receiving the clock signal Ck, and an output terminal coupled with a gate terminal of the NMOS transistor 310 for providing it the clock signal Ck being inverted (inverted clock signal Ck).

A circuit is used to maintain the reference node 305 at a reference voltage Vref (with reference to the ground voltage GND). For example, a voltage generator 325 (for example, of band-gap type) provides the reference voltage Vref. An (operational) amplifier 330 has an inverting terminal coupled with the voltage generator 325 for receiving the reference voltage Vref and a non-inverting terminal coupled with the reference node 305. The amplifier 330 is controlled with a (negative) feedback loop. For example, the feedback loop is implemented by a PMOS transistor 335aux having a source terminal coupled with the supply terminal 110v (for receiving the supply voltage Vdd), a drain terminal coupled with the reference node 305 and a gate terminal coupled with an output terminal of the amplifier 330. A (holding) capacitor Chold is coupled between the non-inverting terminal of the amplifier 330 and the ground terminal 110g.

A circuit is used to mirror a current Iaux flowing through the capacitor Caux into a current Isoft flowing through the capacitor Csoft. For example, a further PMOS transistor 335soft likewise has a source terminal coupled with the supply terminal 110v (for receiving the supply voltage Vdd) and a gate terminal coupled with the output terminal of the amplifier 330; the capacitor Csoft has a terminal coupled with a drain terminal of the PMOS transistor 335soft, and another terminal coupled with the ground terminal 110g. A switch, for example, an NMOS transistor 340 is coupled in parallel to the capacitor Csoft. Particularly, a source terminal of the NMOS transistor 340 is coupled with the terminal of the capacitor Csoft coupled with the ground terminal 110g, and a drain terminal of the NMOS transistor 340 is coupled with the other terminal of the capacitor Csoft. A gate terminal of the NMOS transistor 340 receives the same discharge signal Sdisc as above (for example, provided by the control circuit of the DC-DC converter).

A capacitance of the capacitor Caux is lower than a capacitance of the capacitor Caux (both of them denoted with the same references); particularly, the capacitance Csoft is a multiple of the capacitance Caux by a scale factor Kc>1 (Csoft=Kc·Caux), for example, with Kc=10-100. Conversely, a gain factor βaux of the PMOS 335aux is higher than a gain factor βsoft of the PMOS 335soft (for example, obtained by making the PMOS 335aux with a higher channel width to channel length ratio than the PMOS 335soft); therefore, for the same gate to source voltage, the current Iaux is a multiple of the current Isoft by a scale factor Ki>1 (Iaux=Ki·Isoft), for example, with Ki=10-100. The reference voltage Vref is correlated to the target voltage Vtarget; particularly, the target voltage Vtarget is a multiple of the reference voltage Vref by a scale factor Kv (Vtarget=Kv·Vref), for example, with Kv=0.2-5.0.

As above, as soon as the DC-DC converter is turned on, the discharge signal Sdisc is asserted to the supply voltage Vdd. Therefore, the NMOS transistor 315 turns on thereby short-circuiting the capacitor Csoft; the capacitor Csoft then completely discharges through the NMOS transistor 340 almost immediately, thereby bringing the soft-start voltage Vsoft to the ground voltage GND. The discharge signal Sdisc is then deasserted to the ground voltage GND, so that the NMOS transistor 340 turns off.

During each period (1/fck) of the clock signal Ck, in a first half-period the clock signal k is equal to the supply voltage Vdd and in a second half-period the clock signal Ck is equal to the ground voltage GND. Starting from the first half-period (Ck=Vdd and then Ck=GND), the NMOS transistor 315 turns on and the NMOS transistor 310 turns off. The capacitor Caux then completely discharges through the NMOS transistor 315 almost immediately, thereby bringing its voltage to the reference voltage GND. In the second half-period (Ck=GND and then C̄k̄=Vdd), the NMOS transistor 315 turns off and the NMOS transistor 310 turns on. The capacitor Caux is then charged to the reference voltage Vref (maintained at the reference node 305 by the amplifier 330). During each period of the clock signal Ck the current Iaux has a relatively low (average) value that is substantially constant. Indeed, in the half-period in which the capacitor Caux is coupled with the reference node 305, a current required to charge the capacitor Caux is mostly provided by the capacitor Chold (maintained at the reference voltage Vref by the amplifier 335 as well), which absorbs a part of the current Iaux increasing as the current absorbed by the capacitor Caux decreases. In the half-period in which the capacitor Caux is instead insulated from the reference node 305, the current Iaux continues charging the capacitor hold. The capacitor Chold has a relatively high capacitance (denoted with the same reference), for example, equal to 5-20 times the capacitance Caux, in order to ensure that the voltage at the reference node 305 remains substantially constant (at the reference voltage Vref).

More formally, during each period of the clock signal C an electrical charge Qaux transferred to the capacitor Caux (in a short fraction thereof) is:

$$Q\text{aux} = C\text{aux} \cdot V\text{ref};$$

In order to guarantee a stable condition, the same electrical charge Qaux is provided by the current Iaux over the same period of the clock signal 1/fck:

$$I\text{aux} = \frac{Q\text{aux}}{1/fck} = C\text{aux} \cdot V\text{ref} \cdot fck.$$

In this way, the circuit implements a current generator (providing the current Iaux with a substantially constant value) based on the switching of the capacitor Caux.

The capacitor Csoft is charged continuously by the current Isoft having an average value given by:

$$I\text{soft} = \frac{I\text{aux}}{ki} = \frac{C\text{aux} \cdot V\text{ref} \cdot fck}{ki}.$$

Therefore, the time required to charge the capacitor Csoft to the target voltage Vtarget by the (substantially constant) current Isoft, defining the duration Tsoft of the soft-start phase, is:

$$T\text{soft} = \frac{C\text{soft} \cdot V\text{target}}{I\text{soft}} = \frac{C\text{soft} \cdot V\text{target} \cdot ki}{C\text{aux} \cdot V\text{ref} \cdot fck},$$

and then:

$$T\text{soft} = \frac{kc \cdot kv \cdot ki}{fck}.$$

As above, this allows obtaining a soft-start phase having a relatively long duration with capacitors having relatively low capacitance and PMOS transistors providing relatively high currents, provided that the capacitance soft is higher than the capacitance Caux (Kc>1) and/or the gain factor βaux of the PMOS 335aux is higher than the gain factor βsoft of the PMOS 335soft. This is due to the fact that the capacitor Csoft is only charged by a fraction of the current Iaux generated by the switching of the capacitor Caux, which may be made relatively small by decreasing the capacitance Caux and/or increasing the gain factor βaux. As a result, the soft-start circuit 140 may be provided as an internal component of the integrated circuit of the DC-DC converter with no significant area occupation thereof.

Moreover, in this case as well the soft-start duration Tsoft is very accurate, since it depends on the clock frequency fck (very accurate by its nature) and on (matching) factors (Kc between capacitances, Ki between gain factors and Ku between voltages) that may be controlled relatively easily (especially in the manufacturing processes of integrated circuits). The soft-start duration Tsoft may also be programmed by changing the clock frequency fck and/or the reference voltage Vref.

Figure 5:
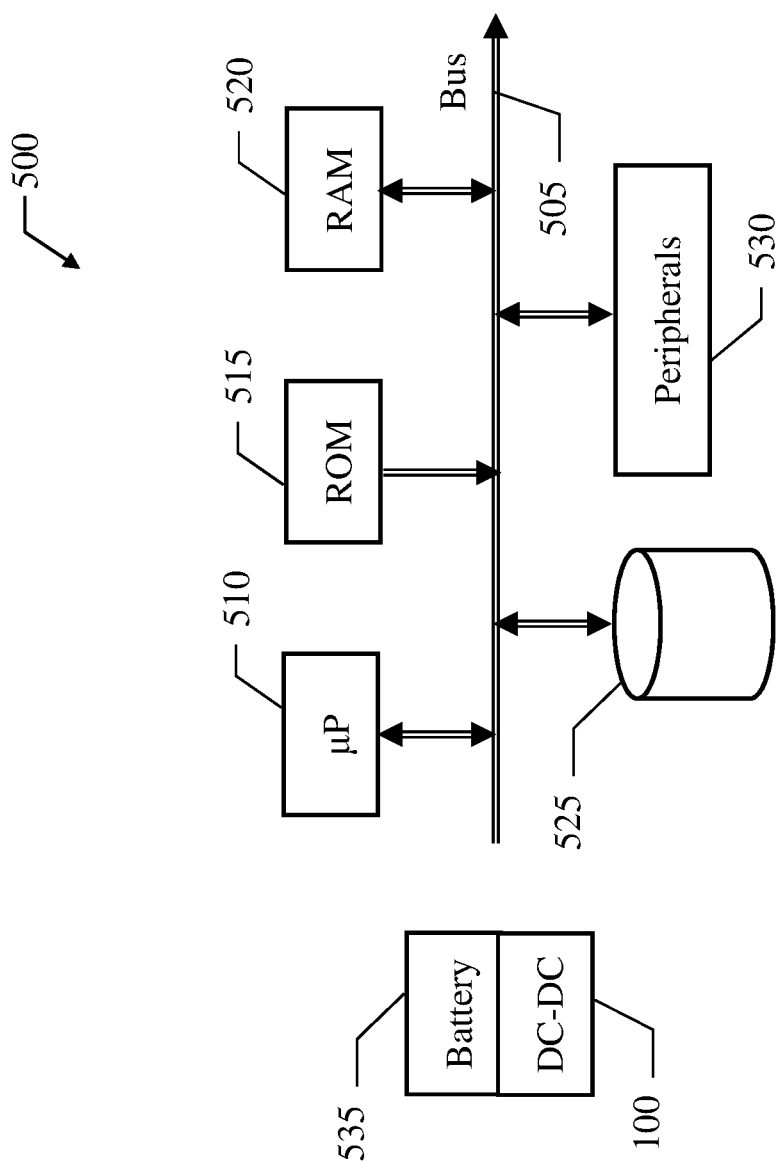
FIG. 5 shows a schematic block diagram of a system incorporating the DC-DC converter.

With reference now to FIG. 5, a schematic block diagram is shown of a system 500 incorporating the DC-DC converter 100 according to an embodiment of the present disclosure.

For example, the system 500 is a smart-phone, a tablet, a laptop and so on. The system 500 comprises several units that are connected among them through a bus structure 505 (with one or more levels). Particularly, a microprocessor (μP) 510, or more, provides a logic capability of the system 500; a non-volatile memory (ROM) 515 stores basic code for a bootstrap of the system 500 and a volatile memory (RAM) 520 is used as a working memory by the microprocessor 510. The system has a mass-memory 525 for storing programs and data (for example, a flash E$^2$PROM). Moreover, the system 500 comprises a number of controllers of peripherals 530, such as a mobile transceiver, a Wi-Fi card, a touch-screen, a loudspeaker, a microphone, a GPS receiver and so on. A battery 535 supplies the different units of the system 500, either directly (by a supply voltage provided by it) or via the DC-DC converter 100 (by a supply voltage of different value obtained by converting the supply voltage of the battery 535).

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may be practiced even without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. Moreover, items presented in a same group and different embodiments, examples or alternatives are not to be construed as de facto equivalent to each other (but they are separate and autonomous entities). In any case, each numerical value should be read as modified according to applicable tolerances; particularly, unless otherwise indicated, the terms "substantially", "about", "approximately" and the like should be understood as within 10%, preferably 5% and still more preferably 1%. Moreover, each range of numerical values should be intended as expressly specifying any possible number along the continuum within the range (comprising its end points). Ordinal or other qualifiers are merely used as labels to distinguish elements with the same name but do not by themselves connote any priority, precedence or order. The terms include, comprise, have, contain, involve and the like should be intended with an open, non-exhaustive meaning (i.e., not limited to the recited items), the terms based on, dependent on, according to, function of and the like should be intended as a non-exclusive relationship (i.e., with possible further variables involved), the term a/an should be intended as one or more items (unless expressly indicated otherwise), and the term means for (or any means-plus-function formulation) should be intended as any structure adapted or configured for carrying out the relevant function.

For example, an embodiment provides a DC-DC converter for converting an input voltage (of direct type) into an output voltage (of direct type) different from the input voltage. However, the DC-DC convert may be of any type (for example, buck or step-down, boost or step-up, buck-boost, flyback, feedforward and the like, for converting any input voltage into any output voltage, either lower or higher, provided in integrated form, in discrete form, in any combination thereof, and so on).

In an embodiment, the DC-DC converter comprises a switching circuit for switching a supply of the input voltage to an energy storage circuit adapted to generating the output voltage. However, the switching circuit may be of any type (for example, comprising NMOS, PMOS, BJT and the like transistors, any combination thereof, level shifters and so on) and it may be used to supply any energy storage circuit (for example, comprising an inductor, a capacitor, a transformer, with or without a diode, and so on).

In an embodiment, the DC-DC converter comprises a driving circuit for driving the switching circuit according to a comparison between the output voltage and a comparison voltage. However, the driving circuit may operate in any way (for example, by comparing the comparison voltage with the whole output voltage, a fraction thereof and so on).

In an embodiment, the DC-DC converter comprises a soft-start circuit for raising the comparison voltage from a start voltage to a target voltage during a soft-start phase of the DC-DC converter having a soft-start duration. However, the comparison voltage may be raised from any start voltage to any target voltage, during the soft-start phase having any duration (for example, pre-determined, programmable and so on).

In an embodiment, the soft-start circuit comprises a soft-start capacitor for providing the comparison voltage during the start phase, the soft-start capacitor having a soft-start capacitance. However, the soft-start capacitance may have any value.

In an embodiment, the soft-start circuit comprises an auxiliary capacitor having an auxiliary capacitance. However, the auxiliary capacitance may have any value.

In an embodiment, the soft-start circuit comprises a further switching circuit for alternately charging and discharging the auxiliary capacitor with an auxiliary current according to a clock signal having a clock frequency. However, the further switching circuit may be of any type (for example, based on any switches, such as NMOS/PMOS transistors, NPN/PNP BJTs, any combination thereof and the like, either of different type and controlled by a same signal or of the same type and controlled by different signals) and it may be used to charge and discharge the auxiliary capacitor with any auxiliary current (for example, with any value, any wave form, provided by a current generator, a supply voltage and so on) between each pair of voltages (for example, starting from any voltage, either the same as or different from the start voltage, to any reference voltage, supply voltage and so on); moreover, the clock signal may be of any type (for example, oscillating between any value, with any duty-cycle, with any frequency and so on).

In an embodiment, the soft-start circuit comprises a charging circuit for generating a soft-start current according to said charging and discharging the auxiliary capacitor, the soft-start current depending on the auxiliary capacitance, the auxiliary current and the clock frequency. However, the soft-start current may be of any type (for example, with any value, pulsed, constant and the like) and it may be generated in any way (for example, according to a time required to charge the auxiliary capacitor, mirroring the auxiliary current generated with a switched-capacitor technique), and so on).

In an embodiment, the charging circuit is for applying the soft-start current to the soft-start capacitor, thereby charging the soft-start capacitor from the start voltage to the target voltage during the soft-start phase having the soft-start duration depending on the clock frequency, on a capacitance ratio between the soft-start capacitance and the auxiliary capacitance and on a current ratio between the auxiliary current and the soft-start current. However, the soft-start current may be applied to the soft-start capacitor in any way (for example, intermittently, continuously and so on).

In an embodiment, the capacitance ratio and/or the current ratio are higher than 1. However, the desired value of the soft-start duration may be obtained in different ways (for example, only with the auxiliary capacitance lower than the soft-start capacitance, only with the auxiliary current higher than the soft-start current, with both on them and so on).

Further embodiments provide additional advantageous features, which may however be omitted at all in a basic implementation.

Particularly, in an embodiment the soft-start circuit comprises a circuit for charging the soft-start capacitor during a fraction of each period of the clock signal having a duration determined by a time required to charge the auxiliary capacitor from the start voltage to a reference voltage, thereby making the soft-start duration further depending on the reference voltage. However, the fraction of the period may be based on any reference voltage (for example, with any value, fixed, programmable and so on); moreover, this result may be obtained in any way (for example, by monitoring the voltage at the auxiliary capacitor, its derivative and so on).

In an embodiment, the further switching circuit comprises an auxiliary current generator for generating the auxiliary current of direct type. However, the auxiliary current may have any value.

In an embodiment, the further switching circuit comprises a circuit for alternately coupling the auxiliary capacitor to the auxiliary current generator and to a ground terminal (for receiving the start voltage) according to the clock signal to charge and discharge, respectively, the auxiliary capacitor between the start voltage and a supply voltage higher than the reference voltage. However, the supply voltage may have any value (in either absolute or relative terms); moreover, this result may be achieved in any way (for example, by using the clock signal alone, the clock signal and the inverted clock signal, and so on).

In an embodiment, the charging circuit comprises a soft-start current generator for generating the soft-start current of direct type. However, the soft-start current may have any value.

In an embodiment, the charging circuit comprises a circuit for generating a pulse signal according to a comparison between a voltage at the auxiliary capacitor and the reference voltage. However, this circuit may be implemented in any way (for example, with a comparator and any logic gate, a differentiator, and so on).

In an embodiment, the charging circuit comprises a circuit for coupling the soft-start current generator with the soft-start capacitor according to the pulse signal. However, this circuit may be of any type (for example, a PMOS transistor, an NMOS transistor, a BJT and so on).

In an embodiment, the soft-start circuit comprises a circuit for charging the soft-start capacitor with the soft-start current corresponding to the auxiliary current. However, the auxiliary current may be of any type (for example, constant, oscillating and so on) and the soft-start current may correspond thereto in any way (for example, equal, a fraction, a multiple and so on).

In an embodiment, the further switching circuit comprises a circuit for maintaining a reference node at a reference voltage. However, the reference voltage may have any value; moreover, this result may be achieved in any way (for example, by an operational amplifier, any feedback network and so on).

In an embodiment, the further switching circuit comprises a circuit for alternately coupling the auxiliary capacitor to the reference node and to a ground terminal (for receiving the start voltage) according to the clock signal to charge and discharge, respectively, the auxiliary capacitor between the start voltage and the reference voltage. However, this result may be achieved in any way (for example, by using the clock signal alone, the clock signal and the inverted clock signal, and so on).

In an embodiment, the charging circuit comprises a circuit for mirroring the auxiliary current into the soft-start current, thereby making the soft-start duration further depending on the reference voltage. However, the auxiliary current may be mirrored in any way (for example, to have the soft-start current equal to, lower than or even higher than the auxiliary current) and with any circuit (for example, by an amplifier biasing two transistors of any type in the same way, by a current mirror and so on).

In an embodiment, the further switching circuit comprises an auxiliary transistor having a first conduction terminal for receiving a supply voltage, a second conduction terminal coupled with the reference node and a control terminal. However, the auxiliary transistor may be of any type (for example, a MOS transistor with source, drain and gate, a BJT with emitter, collector and base, and so on).

In an embodiment, the further switching circuit comprises an amplifier having a first input terminal for receiving the reference voltage, a second input terminal coupled with the reference node and an output terminal coupled with the control terminal of the auxiliary transistor. However, the amplifier may be of any type (for example, an operational amplifier, a transistor in an amplifier configuration and so on).

In an embodiment, the charging circuit comprises a soft-start transistor having a first conduction terminal for receiving the supply voltage, a second conduction terminal coupled with the soft-start capacitor and a control terminal coupled with the output terminal of the amplifier. However, the soft-start transistor may be of any type (either the same or different with respect to the auxiliary transistor).

In an embodiment, the soft-start transistor has a soft-start gain factor and the auxiliary transistor has an auxiliary gain factor higher than the soft-start gain factor. However, the (soft-start/auxiliary) gain factors may have any values (in either absolute or relative terms).

In an embodiment, the charging circuit comprises a holding capacitor coupled between the ground terminal and the reference node, the holding capacitor having a holding capacitance higher than the auxiliary capacitance. However, the holding capacitance may have any value (in either absolute or relative terms); in any case, this component may also be omitted at all (for example, when the same result is obtained raising a time constant of the circuit by increasing its resistance).

In an embodiment, the DC-DC converter comprises an integrated circuit that is integrated on a body of semiconductor material, the integrated circuit comprising the switching circuit, the driving circuit and the soft-start circuit. However, the body may be of any type (for example, silicon, SOI and so on) and the integrated circuit may be provided in any way (for example, packaged, in raw wafer form, as a bare die and so on).

In an embodiment, the DC-DC converter further comprises the energy storage circuit coupled with the integrated circuit. However, DC-DC converter may be put on the market as a complete product or only as the integrated circuit (for completion of the DC-DC converter with its external components).

An embodiment provides a system comprising at least one DC-DC converter of above. However, the system may comprise any number of DC-DC converters and it may be of any type (partial, different and additional types with respect to the ones mentioned above).

Generally, similar considerations apply if the DC-DC converter and the system each has a different structure or comprises equivalent components (for example, of different materials) or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

An embodiment provides a method for converting an input voltage of direct type into an output voltage of direct type different from the input voltage. In an embodiment, the method comprises switching a supply of the input voltage to an energy storage circuit adapted to generating the output voltage according to a comparison between the output voltage and a comparison voltage. In an embodiment, the method comprises raising the comparison voltage from a start voltage to a target voltage during a soft-start phase of the DC-DC converter having a soft-start duration. In an embodiment, said raising the comparison voltage comprises the following steps in a soft-start circuit comprising a soft-start capacitor for providing the comparison voltage during the start phase, the soft-start capacitor having a soft-start capacitance, and an auxiliary capacitor having an auxiliary capacitance lower than the soft-start capacitance. In an embodiment, said raising the comparison voltage comprises alternately charging and discharging the auxiliary capacitor with an auxiliary current according to a clock signal having a clock frequency. In an embodiment, said raising the comparison voltage comprises generating a soft-start current according to said charging and discharging the auxiliary capacitor, the soft-start current depending on the auxiliary capacitance, the auxiliary current and the clock frequency. In an embodiment, said raising the comparison voltage comprises applying the soft-start current to the soft-start capacitor thereby charging the soft-start capacitor from the start voltage to the target voltage during the soft-start phase having the soft-start duration depending on the clock frequency, on a capacitance ratio between the soft-start capacitance and the auxiliary capacitance and on a current ratio between the auxiliary current and the soft-start current. In an embodiment, the capacitance ratio and/or the current ratio are higher than 1.

Generally, similar considerations apply if the same solution is implemented with an equivalent method (by using similar steps with the same functions of more steps or portions thereof, removing some non-essential steps or adding further optional steps); moreover, the steps may be performed in a different order, concurrently or in an interleaved way (at least in part).

What is claimed is:

1. A direct current to direct current (DC-DC) converter comprising:
   a first switching circuit configured to switch a supply of an input voltage to an energy storage circuit configured to generate an output voltage;
   a driving circuit configured to drive the first switching circuit according to a comparison between the output voltage and a comparison voltage; and
   a soft-start circuit configured to raise the comparison voltage from a start voltage to a target voltage during a soft-start phase of the DC-DC converter having a soft-start duration, the soft-start circuit comprising:
      a soft-start capacitor configured to provide the comparison voltage during the start phase, the soft-start capacitor having a soft-start capacitance;
      an auxiliary capacitor having an auxiliary capacitance;
      a second switching circuit configured to alternately charge and discharge the auxiliary capacitor with an auxiliary current according to a clock signal having a clock frequency; and
      a charging circuit configured to:
         generate a soft-start current according to the charging and discharging the auxiliary capacitor, the soft-start current depending on the auxiliary capacitance, the auxiliary current and the clock frequency; and
         apply the soft-start current to the soft-start capacitor thereby charging the soft-start capacitor from the start voltage to the target voltage during the soft-start phase depending on the clock frequency, a capacitance ratio between the soft-start capacitance and the auxiliary capacitance and a current ratio between the auxiliary current and the soft-start current,
         wherein the capacitance ratio and/or the current ratio is higher than 1.

2. The DC-DC converter according to claim 1, wherein the soft-start circuit is configured to charge the soft-start capacitor during a fraction of each period of the clock signal having a duration determined by a time required to charge the auxiliary capacitor from the start voltage to a reference voltage, thereby making the soft-start duration further depending on the reference voltage.

3. The DC-DC converter according to claim 2, wherein the second switching circuit comprises:
   an auxiliary current generator configured to generate the auxiliary current of a direct type, and
   a first circuit configured to:
      alternately couple the auxiliary capacitor to the auxiliary current generator and to a ground terminal, and
      receive the start voltage, according to the clock signal to charge and discharge, respectively, the auxiliary capacitor between the start voltage and a supply voltage higher than the reference voltage.

4. The DC-DC converter according to claim 3, wherein the charging circuit comprises:
   a soft-start current generator configured to generate the soft-start current of a direct type,
   a second circuit configured to generate a pulse signal according to a comparison between a voltage at the auxiliary capacitor and the reference voltage, and
   a third circuit configured to couple the soft-start current generator with the soft-start capacitor according to the pulse signal.

5. The DC-DC converter according to claim 4, wherein the second circuit comprises a voltage generator and a pulse generator.

6. The DC-DC converter according to claim 4, wherein the third circuit comprises a PMOS transistor.

7. The DC-DC converter according to claim 3, wherein the first circuit comprises a PMOS transistor, an NMOS transistor and an inverter.

8. The DC-DC converter according to claim 1, wherein start voltage is ground.

9. The DC-DC converter according to claim 1, wherein the soft-start circuit is configured to charge the soft-start capacitor with the soft-start current corresponding to the auxiliary current.

10. The DC-DC converter according to claim 1, wherein the second switching circuit comprises:
    a fourth circuit configured to maintain a reference node at a reference voltage, and
    a fifth circuit configured to:
       alternately couple the auxiliary capacitor to the reference node and to a ground terminal, and
       receive the start voltage, according to the clock signal to charge and discharge, respectively, the auxiliary capacitor between the start voltage and the reference voltage.

11. The DC-DC converter according to claim 10, wherein the charging circuit comprises a sixth circuit configured to mirror the auxiliary current into the soft-start current thereby making the soft-start duration further depending on the reference voltage.

12. The DC-DC converter according to claim 10, wherein the fourth circuit comprises:
    an auxiliary transistor having a first conduction terminal configured to receive a supply voltage, a second conduction terminal coupled with the reference node and a control terminal,
    an amplifier having a first input terminal configured to receive the reference voltage, a second input terminal coupled with the reference node and an output terminal coupled with the control terminal of the auxiliary transistor.

13. The DC-DC converter according to claim 10, wherein the charging circuit comprises a soft-start transistor having a first conduction terminal configured to receive the supply voltage, a second conduction terminal coupled with the soft-start capacitor and a control terminal coupled with an output terminal of an amplifier.

14. The DC-DC converter according to claim 13, wherein the soft-start transistor has a soft-start gain factor and an auxiliary transistor has an auxiliary gain factor higher than the soft-start gain factor.

15. The DC-DC converter according to claim 13, wherein the charging circuit comprises a holding capacitor coupled between the ground terminal and the reference node, the holding capacitor having a holding capacitance higher than the auxiliary capacitance.

16. The DC-DC converter according to claim 1, wherein the DC-DC converter comprises an integrated circuit being integrated on a body of semiconductor material, wherein the integrated circuit comprising the switching circuit, the driving circuit and the soft-start circuit, and wherein the DC-DC converter further comprises the energy storage circuit coupled with the integrated circuit.

17. A method for converting an input voltage of a direct type into an output voltage of a direct type different from the input voltage, the method comprising:
  switching a supply of the input voltage to an energy storage circuit for generating the output voltage, according to a comparison between the output voltage and a comparison voltage; and
  raising the comparison voltage from a start voltage to a target voltage during a soft-start phase of a direct current to direct current (DC-DC) converter having a soft-start duration,
  wherein raising the comparison voltage comprises:
    alternately charging and discharging, by a soft-start circuit, an auxiliary capacitor having an auxiliary capacitance with an auxiliary current according to a clock signal having a clock frequency;
    generating, by the soft-start circuit, a soft-start current according to charging and discharging the auxiliary capacitor, wherein the soft-start current depends on the auxiliary capacitance, the auxiliary current and the clock frequency; and
    applying, by the soft-start circuit, the soft-start current to the soft-start capacitor thereby charging the soft-start capacitor from the start voltage to the target voltage during the soft-start phase having the soft-start duration depending on the clock frequency, on a capacitance ratio between the soft-start capacitance and the auxiliary capacitance and on a current ratio between the auxiliary current and the soft-start current,
  wherein the capacitance ratio and/or the current ratio is higher than 1, and
  wherein the soft start circuit comprises a soft-start capacitor for providing the comparison voltage during the soft-start phase, the soft-start capacitor having a soft-start capacitance.

18. The method according to claim 17, wherein start voltage is ground.

* * * * *